(12) United States Patent
Munakata

(10) Patent No.: US 9,826,646 B2
(45) Date of Patent: Nov. 21, 2017

(54) COMPONENT BUILT-IN BOARD AND METHOD OF MANUFACTURING THE SAME, AND MOUNTING BODY

(71) Applicant: FUJIKURA LTD., Tokyo (JP)

(72) Inventor: Koji Munakata, Sakura (JP)

(73) Assignee: FUJIKURA LTD., Tokyo (JP)

(*) Notice: Subject to any disclaimer, the term of this patent is extended or adjusted under 35 U.S.C. 154(b) by 0 days.

(21) Appl. No.: 14/721,247

(22) Filed: May 26, 2015

(65) Prior Publication Data

US 2015/0351230 A1  Dec. 3, 2015

(30) Foreign Application Priority Data

May 27, 2014 (JP) ................................. 2014-109460

(51) Int. Cl.
*H05K 1/02* (2006.01)
*H05K 3/46* (2006.01)
(Continued)

(52) U.S. Cl.
CPC ....... *H05K 3/4614* (2013.01); *H01L 25/0657* (2013.01); *H05K 1/186* (2013.01);
(Continued)

(58) Field of Classification Search
CPC ........ H05K 1/181; H05K 1/185; H05K 1/186; H05K 1/0206; H05K 1/0271; H05K 3/30;
(Continued)

(56) References Cited

U.S. PATENT DOCUMENTS 7,706,148 B2 * 4/2010 Hsu ..................... H01L 23/5385
361/770
8,395,056 B2 * 3/2013 Nakamura ........... H05K 3/4069
174/164
(Continued)

FOREIGN PATENT DOCUMENTS

JP  2006-210870 A  8/2006
JP  2007-80857 A  3/2007
(Continued)

OTHER PUBLICATIONS

Office Action dated Mar. 31, 2015, issued in corresponding Japanese application No. 2014-109460 (4 pages).

*Primary Examiner* — Ishwarbhai B Patel
*Assistant Examiner* — Paresh Paghadal
(74) *Attorney, Agent, or Firm* — Westerman, Hattori, Daniels & Adrian, LLP

(57) ABSTRACT

A component built-in board comprises a multi-layer structure comprising a plurality of unit boards stacked therein a plurality of electronic components built in thereto in a stacking direction. The plurality of unit boards include: a first board having a first insulating layer and comprising an opening in which the electronic component is housed; and an intermediate board adjacent to the first board and comprising a first adhesive layer provided on at least a side of the first board of a second insulating layer. The intermediate board includes a first wiring layer formed at a position overlapping in the stacking direction a gap between an inner periphery of the opening and an outer periphery of the electronic component of the first board on a surface on the first board side of the second insulating layer.

15 Claims, 7 Drawing Sheets

(51) Int. Cl.
  *H05K 1/18* (2006.01)
  *H01L 25/065* (2006.01)
  *H01L 23/538* (2006.01)

(52) U.S. Cl.
  CPC .............. *H01L 23/5389* (2013.01); *H01L 2224/16225* (2013.01); *H05K 3/4688* (2013.01); *H05K 2201/0187* (2013.01); *H05K 2201/096* (2013.01); *H05K 2201/09136* (2013.01); *Y10T 156/10* (2015.01)

(58) Field of Classification Search
  CPC .. H05K 3/4611; H05K 3/4614; H05K 3/4623; H05K 3/4688; H05K 3/4697
  See application file for complete search history.

(56) References Cited

U.S. PATENT DOCUMENTS

| | | | | |
|---|---|---|---|---|
| 2009/0154132 A1* | 6/2009 | Okamoto | ............ | H01L 23/5389 361/804 |
| 2010/0025082 A1* | 2/2010 | Sasaoka | ............... | H05K 1/0206 174/252 |
| 2011/0266666 A1* | 11/2011 | Maeda | ................ | H01L 23/3128 257/698 |
| 2013/0213699 A1* | 8/2013 | Chisaka | ................. | H05K 1/186 174/255 |
| 2014/0133118 A1* | 5/2014 | Sano | ...................... | H05K 1/186 361/761 |
| 2014/0138130 A1* | 5/2014 | Chang | ................. | H05K 3/4697 174/257 |
| 2014/0211437 A1* | 7/2014 | Ueta | ...................... | H05K 1/185 361/761 |
| 2014/0233199 A1 | 8/2014 | Munakata et al. | | |
| 2014/0268594 A1* | 9/2014 | Wang | ..................... | H05K 1/183 361/749 |
| 2015/0255380 A1* | 9/2015 | Chen | ................. | H01L 23/49568 361/707 |

FOREIGN PATENT DOCUMENTS

| | | | | |
|---|---|---|---|---|
| JP | WO 2013027795 A1 * | 2/2013 | ............. | H05K 1/186 |
| JP | 5427305 B1 | 2/2014 | | |
| WO | 2012/046829 A1 | 4/2012 | | |
| WO | 2013/027795 A1 | 2/2013 | | |

* cited by examiner

COMPONENT BUILT-IN BOARD AND METHOD OF MANUFACTURING THE SAME, AND MOUNTING BODY

CROSS-REFERENCE TO RELATED APPLICATIONS

This application is based upon and claims the benefit of priority from the prior Japanese Patent Application No. 2014-109460, filed on May 27, 2014, the entire contents of which are incorporated herein by reference.

BACKGROUND OF THE INVENTION

Field of the Invention

This invention relates to a component built-in board having an electronic component built in thereto, and a method of manufacturing the same, and to a mounting body.

Description of the Prior Art

In order to respond to the demand in recent years for further miniaturization or higher performance levels mainly in compact precision electronic instruments, miniaturization or higher levels of integration are being required also of substrate-mounted semiconductor devices. In response to such a demand, it is becoming increasingly necessary to handle higher levels of integration while advancing miniaturization of semiconductor devices, by three-dimensional packaging technology such as CoC (Chip on Chip) and PoP (Package on Package), or by component built-in board technology.

A known semiconductor device employing component built-in board technology is the multi-layer printed wiring board disclosed in Japanese Unexamined Patent Application Publication No. 2007-80857 A. This multi-layer printed wiring board has a plurality of printed wiring boards that each have a wiring layer formed on an insulating board thereof stacked via an insulator spacer having an adhesive layer formed on both surfaces thereof, and has an electronic component built in to a space between the printed wiring boards formed by the insulator spacer.

SUMMARY OF THE INVENTION

However, in the multi-layer printed wiring board of the conventional technology disclosed in the above-mentioned Japanese Unexamined Patent Application Publication No. 2007-80857 A, the insulator spacer which is thicker than a thickness of the built-in electronic component is disposed between each of the printed wiring boards, and stacking is performed in multi-layers in a state where the space for building in the electronic component is formed between each of the printed wiring boards.

Therefore, there are problems that a manufacturing step becomes complicated and that it becomes difficult to achieve thinning of the multi-layer printed wiring board overall. Moreover, there is a problem that when the adhesive layer has undergone flow displacement so as to penetrate inside the space during stacking, each of the printed wiring boards deforms in a thickness direction in a periphery of the space, hence the multi-layer printed wiring board warps and deforms overall, and effects of that deformation end up extending to an outer surface of the multi-layer printed wiring board.

This invention has an object of overcoming the above-mentioned problems due to the conventional technology to provide a component built-in board that allows overall thinning and deformation prevention thereof to be achieved while a manufacturing step thereof is simplified and a method of manufacturing the component built-in board, and to provide a mounting body.

A component built-in board according to an embodiment of the present invention, the component built-in board being a component built-in board of multi-layer structure comprising a plurality of unit boards stacked therein and a plurality of electronic components built in thereto in a stacking direction, wherein the plurality of electronic components include a first electronic component, and the plurality of unit boards include: a first board having a first insulating layer and comprising an opening in which the first electronic component is housed; and an intermediate board adjacent to the first board and comprising a first adhesive layer provided on at least a side of the first board of a second insulating layer, and the intermediate board includes a first wiring layer formed at a position overlapping in the stacking direction a gap between an inner periphery of the opening and an outer periphery of the first electronic component of the first board on a surface on the first board side of the second insulating layer.

As a result of the component built-in board according to the embodiment of the present invention, in a component built-in board having a plurality of unit boards stacked therein and having a plurality of electronic components built in thereto, a first wiring layer is formed at a position overlapping in a stacking direction a gap between an inner periphery of an opening and an outer periphery of a first electronic component of a first board on a surface on a side of the first board of a second insulating layer of an intermediate board disposed adjacently via a first adhesive layer on the first board, hence inflow or a flow amount of the first adhesive layer into the gap during collective stacking can be suppressed to prevent deformation of the board overall. Moreover, compared to a conventional component built-in board, the number of insulator spacers can be reduced whereby a thickness of a place where the electronic component is housed can be reduced, hence it becomes possible to achieve thinning of the component built-in board overall by a simple manufacturing step.

In another embodiment of the component built-in board, the plurality of unit boards include: a second board comprising: a second wiring layer formed on a side of one surface of a third insulating layer; a first inter-layer conductive layer penetrating the third insulating layer and being connected to the second wiring layer; and a second adhesive layer being provided on a side of the other surface of the third insulating layer, and the second board has a part of the first inter-layer conductive layer connected to the first electronic component on a side of the second adhesive layer.

Moreover, in another embodiment of the component built-in board, the plurality of electronic components include a second electronic component, and the plurality of unit boards include: a third board that is disposed on an opposite side to the first board of the intermediate board, has a fourth insulating layer, and comprises an opening in which the second electronic component is housed at a position overlapping in the stacking direction the first electronic component.

Moreover, in another embodiment of the component built-in board, the intermediate board includes: a third wiring layer formed at a position overlapping in the stacking direction a gap between an inner periphery of the opening and an outer periphery of the second electronic component of the third board on a surface on a side of the third board of the second insulating layer; and the first adhesive layer provided on the third board side.

Moreover, in another embodiment of the component built-in board, the plurality of unit boards include: a fourth board that is disposed between the third board and the intermediate board, comprises: a fourth wiring layer formed on a side of one surface of a fifth insulating layer; a second inter-layer conductive layer penetrating the fifth insulating layer and being connected to the fourth wiring layer; and a third adhesive layer being provided on a side of the other surface of the fifth insulating layer, and a part of the fourth wiring layer is formed at a position overlapping in the stacking direction a gap between an inner periphery of the opening and an outer periphery of the second electronic component of the third board on a surface on a side of the intermediate board of the fifth insulating layer.

Moreover, in another embodiment of the component built-in board, the first wiring layer of the intermediate board is a dummy wiring layer.

Moreover, in another embodiment of the component built-in board, the third wiring layer of the intermediate board is a dummy wiring layer.

Moreover, in another embodiment of the component built-in board, a part of the fourth wiring layer of the fourth board is a dummy wiring layer.

A component built-in board according to another embodiment of the present invention, the component built-in board being a component built-in board of multi-layer structure comprising a plurality of unit boards stacked therein and a plurality of electronic components built in thereto in a stacking direction, wherein the plurality of unit boards include: a first board having a first insulating layer and comprising an opening in which the electronic component is housed; a second board that is adjacent to the first board, comprises: a second wiring layer formed on a side of one surface of a second insulating layer; a first inter-layer conductive layer penetrating the second insulating layer and being connected to the second wiring layer; and a first adhesive layer being provided on a side of the other surface of the second insulating layer; and an intermediate board adjacent to the second board and comprising a second adhesive layer provided on at least a side of the second board of a third insulating layer, and the intermediate board includes a third wiring layer formed at a position overlapping in the stacking direction a gap between an inner periphery of the opening and an outer periphery of the electronic component of the first board on a surface on a side of the second board of the third insulating layer.

As a result of the component built-in board according to the other embodiment of the present invention, in a component built-in board having a plurality of unit boards stacked therein and having a plurality of electronic components built in thereto, a third wiring layer is formed at a position overlapping in a stacking direction a gap between an inner periphery of an opening and an outer periphery of the electronic component of a first board on a surface on a side of a second board of a third insulating layer of an intermediate board further disposed adjacently via a second adhesive layer on the second board disposed adjacently via a first adhesive layer on the first board, hence inflow or a flow amount of the first adhesive layer into the gap during collective stacking can be suppressed to prevent deformation of the board overall. Moreover, compared to a conventional component built-in board, the number of insulator spacers can be reduced whereby a thickness of a place where the electronic component is housed can be reduced, hence it becomes possible to achieve thinning of the component built-in board overall by a simple manufacturing step.

In another embodiment of the other component built-in board, the third wiring layer of the intermediate board is a dummy wiring layer.

A method of manufacturing a component built-in board according to an embodiment of the present invention, the component built-in board being a component built-in board of multi-layer structure comprising a plurality of unit boards stacked therein and a plurality of electronic components built in thereto in a stacking direction, comprises: forming in a first insulating layer an opening in which the electronic component is to be housed, to produce a first board acting as the unit board; forming a first wiring layer at a position overlapping in a stacking direction a gap between an inner periphery of the opening and an outer periphery of the electronic component of the first board on a surface disposed on a side of the first board of a second insulating layer, and providing a first adhesive layer on at least the first board side of the second insulating layer, to produce an intermediate board acting as the unit board; and housing the electronic component in the opening of the first board, disposing the intermediate board adjacently to the first board via the first adhesive layer such that the gap and the first wiring layer overlap in the stacking direction, and stacking a plurality of the unit boards in the stacking direction.

As a result of the method of manufacturing a component built-in board according to the embodiment of the present invention, a component built-in board having a plurality of unit boards stacked therein and having a plurality of electronic components built in thereto is manufactured by housing the electronic component in an opening of a first board produced as a unit board, disposing the intermediate board adjacently to this first board via a first adhesive layer such that a gap and a first wiring layer overlap in a stacking direction, and stacking a plurality of the unit boards in the stacking direction, hence similar working effects to those of the above-described component built-in board can be displayed.

A method of manufacturing a component built-in board according to another embodiment of the present invention, the component built-in board being a component built-in board of multi-layer structure comprising a plurality of unit boards stacked therein and a plurality of electronic components built in thereto in a stacking direction, comprises: forming in a first insulating layer an opening in which the electronic component is to be housed, to produce a first board acting as the unit board; forming a second wiring layer on a surface disposed on a side of the first board of a second insulating layer, and forming a first inter-layer conductive layer that penetrates the second insulating layer and is connected to the second wiring layer and providing a first adhesive layer on a side of the other surface of the second insulating layer, to produce a second board acting as the unit board; forming a third wiring layer at a position overlapping in a stacking direction a gap between an inner periphery of the opening and an outer periphery of the electronic component of the first board on a surface disposed on a side of the second board of a third insulating layer, and providing a second adhesive layer on at least the second board side of the third insulating layer, to produce an intermediate board acting as the unit board; and housing the electronic component in the opening of the first board, disposing the second board adjacently to the first board via the first adhesive layer and disposing the intermediate board adjacently to the second board via the second adhesive layer such that the gap and the third wiring layer overlap in the stacking direction, and stacking a plurality of the unit boards in the stacking direction.

As a result of the method of manufacturing a component built-in board according to the other embodiment of the present invention, a component built-in board having a plurality of unit boards stacked therein and having a plurality of electronic components built in thereto is manufactured by housing the electronic component in an opening of a first board produced as a unit board, disposing a second board adjacently to the first board via a first adhesive layer and further disposing an intermediate board adjacently to the second board via a second adhesive layer such that a gap of the first board and a third wiring layer overlap in a stacking direction, and stacking a plurality of the unit boards in the stacking direction, hence similar working effects to those of the above-described component built-in board can be displayed.

A mounting body according to an embodiment of the present invention has another electronic component surface-mounted on at least one mounting surface of a front surface and a back surface of the above-described component built-in board.

The accompanying drawings, which are incorporated in and constitute a part of the specification, illustrate embodiments of the invention, and together with the general description given above and the detailed description of the embodiments given below, serve to explain the principles of the invention.

DESCRIPTION OF THE PREFERRED EMBODIMENTS

A component built-in board and method of manufacturing the same and a mounting body according to embodiments of this invention will be described in detail below with reference to the accompanying drawings.

Figure 1:
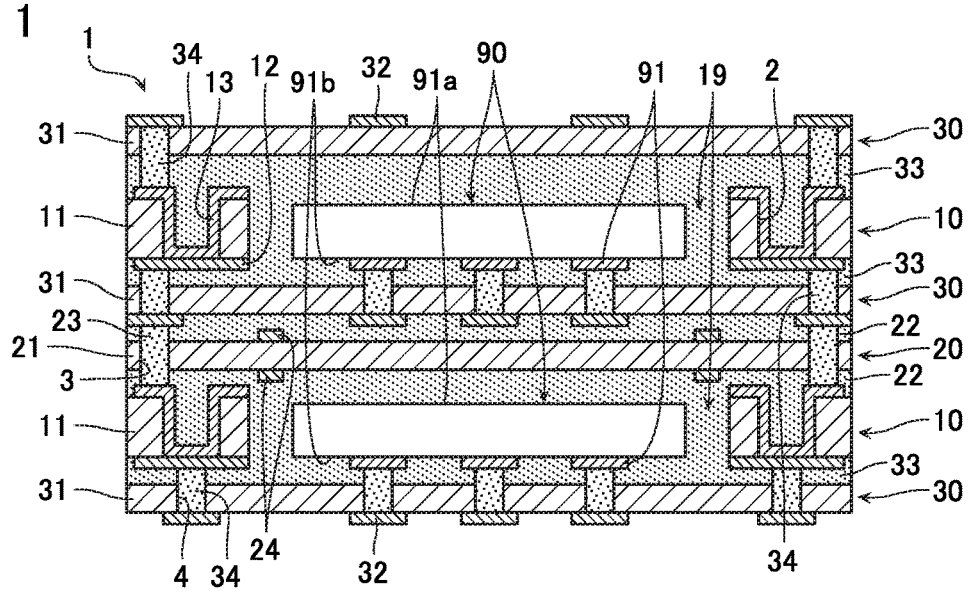
FIG. 1 is a cross-sectional view showing a component built-in board according to a first embodiment of the present invention.
Figure 2:
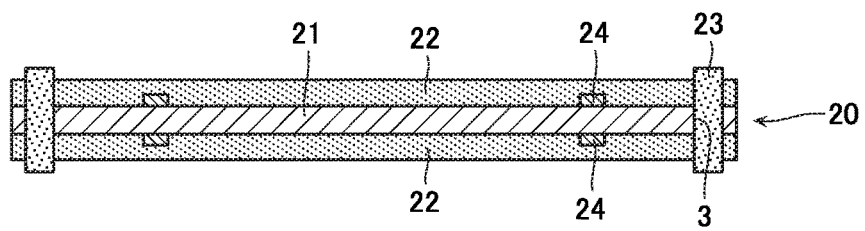
FIG. 2 is a cross-sectional view showing an intermediate board of the same component built-in board.
Figure 3:
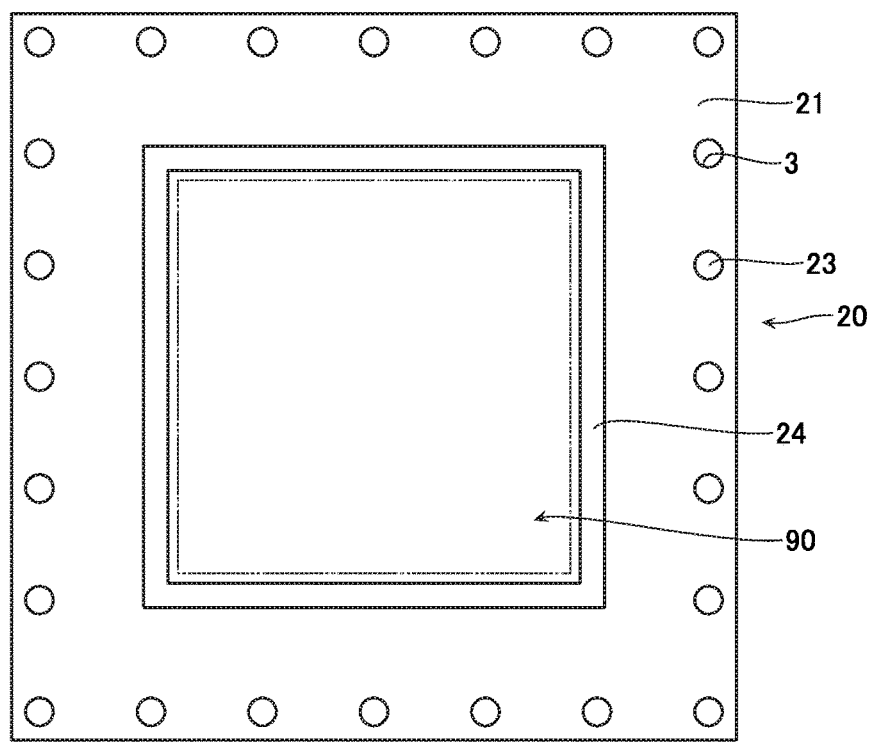
FIG. 3 is a top view showing the intermediate board of the same component built-in board.
Figure 4:
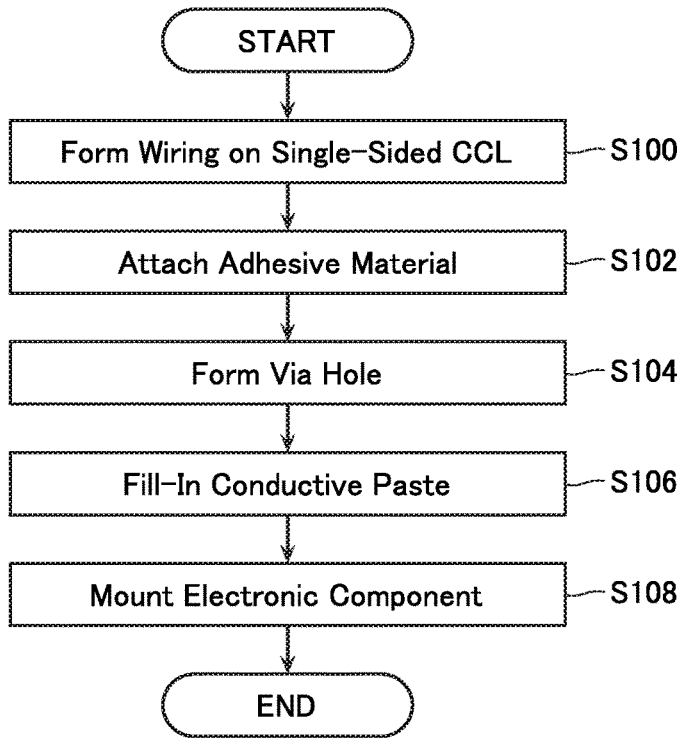
FIG. 4 is a flowchart showing manufacturing steps due to a method of manufacturing the same component built-in board.

FIG. 1 is a cross-sectional view showing a component built-in board according to a first embodiment of the present invention. FIG. 2 is a cross-sectional view showing an intermediate board of the component built-in board, and FIG. 3 is a top view showing the intermediate board. As shown in FIG. 1, a component built-in board 1 has a plurality of unit boards stacked therein and comprises a plurality of electronic components 90 built in thereto in a stacking direction. The component built-in board 1 comprises a structure in which a plurality of double-sided boards 10, an intermediate board 20, and a plurality of single-sided boards 30 acting as the unit boards are stacked collectively by, for example, thermal compression bonding.

In the component built-in board 1 of the present example, the double-sided board 10 disposed on a more downward side in the stacking direction than the intermediate board 20 functions as a first board and, moreover, the single-sided board 30 disposed on a downward side of that double-sided board 10 functions as a second board. In addition, the double-sided board 10 disposed on a more upward side in the stacking direction than the intermediate board 20 functions as a third board and, moreover, the single-sided board 30 disposed between this double-sided board 10 which is the third board and the intermediate board 20, functions as a fourth board. Each of the electronic components 90 is respectively housed in an opening 19 formed in each of the double-sided boards 10, in a state where, for example, a side of a back surface 91a is directed to an upward side in the stacking direction and a side of an electrode formation surface 91b is directed to a downward side in the stacking direction. Note that the electronic component 90 housed in the opening 19 of the double-sided board 10 functioning as the first board functions as a first electronic component, and the electronic component 90 housed in the opening 19 of the double-sided board 10 functioning as the third board functions as a second electronic component.

Each of the double-sided boards 10 respectively comprises: a film-state resin base 11 acting as a first and fourth insulating layer; a wiring 12 formed on sides of both surfaces of this resin base 11; and a via 13 formed by plating inside a via hole 2 that penetrates one of the wirings 12 and the resin base 11, and thereby connecting each of the wirings 12. Moreover, each of the double-sided boards 10 respectively comprises the opening 19 that has the resin base 11 and the wiring 12 removed at a certain place. Note that when the first board is not configured by the double-sided board 10, it is sufficient to configure the first board by the resin base 11 and the opening 19.

The intermediate board 20 is adjacent to at least one of the double-sided boards 10 and comprises: a film-state resin base 21 acting as a second insulating layer; an adhesive layer 22 acting as a first adhesive layer, the adhesive layer 22 being provided on sides of both surfaces of this resin base 21; and a via 23 configured from a conductive paste and formed by filling the conductive paste inside a via hole 3 that penetrates these adhesive layer 22 and resin base 21.

Moreover, as shown in FIGS. 2 and 3, the intermediate board 20 comprises a wiring 24 acting as a first and third wiring layer, the wiring 24 being formed at a position overlapping in the stacking direction a gap between an inner periphery of the opening 19 and an outer periphery of the electronic component 90 housed in this opening 19 of the double-sided board 10 on both surfaces of the resin base 21. Note that the adhesive layer 22 and the wiring 24 may be formed on at least a side of the double-sided 10 of the resin base 21.

Each of the single-sided boards 30 respectively comprises: a film-state resin base 31 acting as a third and fifth insulating layer; a wiring 32 acting as a second and fourth wiring layer, the wiring 32 being formed on a side of one of surfaces of this resin base 31; an adhesive layer 33 acting as a second and third adhesive layer, the adhesive layer 33 being provided on a side of the other of the surfaces of the resin base 31; and a via 34 acting as a first and second inter-layer conductive layer, the via 34 being configured from the conductive paste and formed by filling the conductive paste inside a via hole 4 that penetrates this adhesive layer 33 and the resin base 31.

Note that although details will be mentioned later, the double-sided board 10 and the intermediate board 20 can be configured by a double-sided CCL, and the single-sided board 30 can be configured by a single-sided CCL. Each of the resin bases 11, 21, and 31 is respectively configured by, for example, a resin film of a low permittivity material and having a thickness of about 25 μm. Employable as the resin film are, for example, a polyimide, a polyolefin, a liquid crystal polymer (LCP), and so on.

The wirings 12, 24, and 32 are configured from, for example, a copper foil, and so on, pattern formed on the resin bases 11, 21, and 31. The wiring 24 may be a dummy wiring. Each of the electronic components 90 is configured from an active component of a semiconductor element such as a transistor, an integrated circuit (IC), a diode, and so on, or a passive component such as a resistor, a capacitor, a relay, a piezoelectric element, and so on.

The electronic component 90 shown in FIG. 1 indicates, for example, a WLP (Wafer Level Package) that has been re-wired. Provided on an electrode formation surface 91b side of the electronic component 90 are a plurality of re-wiring electrodes 91 formed on a pad not illustrated, and formed in a periphery of these re-wiring electrodes 91 is an insulating layer not illustrated.

The vias 23 and 34 are configured from the conductive paste respectively filled into the via holes 3 and 4. The conductive paste includes, for example, at least one kind of metal particle of low electrical resistance selected from the likes of nickel, gold, silver, copper, aluminum, and iron, and at least one kind of metal particle of low melting point selected from the likes of tin, bismuth, indium, and lead. Moreover, the conductive paste is configured from a paste having mixed into these metal particles a binder component whose main component is an epoxy, an acrylic, a urethane, and so on.

The conductive paste configured in this way comprises metal sintering type characteristics having a curing temperature of approximately 150° C. to 200° C. and a post-curing melting point of approximately 260° C. or more, and the conductive paste comprises characteristics that, for example, the metal of low melting point contained therein can melt and form an alloy at 200° C. or less, and specifically can form an intermetallic compound with the likes of copper or silver. As a result, a connection between each of the vias 23 and 34 and the wirings 12 and 32 is alloyed by an intermetallic compound during thermal compression bonding of collective stacking.

Note that the conductive paste may also be configured by a nanopaste in which, for example, a filler of the likes of gold, silver, copper, and nickel with a nanolevel particle diameter is mixed into a binder component of the above-described kind. In addition, the conductive paste may also be configured by a paste having metal particles of the above-described nickel, and so on, mixed into a binder component of the above-described kind.

In this case, the conductive paste is characterized in that electrical connection is performed by contact between fellow metal particles. Note that employable as a method of filling the conductive paste into the via holes 3 and 4 is, for example, a printing method, a spin coating method, a spray coating method, a dispensing method, a laminating method, a method combining use of these methods, and so on. The via 13 is configured by plating applied to the via hole 2 in order to make inter-layer connection between the wirings 12 formed on both surfaces of the resin base 11 as mentioned above.

The component built-in board 1 according to the first embodiment has stacked therein six layers of the intermediate board 20, the double-sided board 10, and the single-sided board 30 disposed in that order directed to the downward side in the stacking direction from the intermediate board 20, and the single-sided board 30, the double-sided board 10, and the single-sided board 30 disposed in that order directed to the upward side in the stacking direction from the intermediate board 20.

The intermediate board 20 and the double-sided board 10 on its downward side in the stacking direction and single-sided board 30 on its upward side in the stacking direction are respectively adhered by the adhesive layer 22 of the intermediate board 20, and the double-sided board 10 and the single-sided board 30 are respectively adhered by the adhesive layer 33 of the single-sided board 30. In addition, each of the single-sided boards 30 excluding the single-sided board 30 on an uppermost side in the stacking direction is disposed in a state where some of the vias 34 are connected to the re-wiring electrode 91 of the electronic component 90 and the wiring 32 is positioned on a downward side in the stacking direction of the resin base 31. The adhesive layers 22 and 33 are configured from, for example, an organic system adhesive material including a volatile component, such as an epoxy system or acrylic system, and so on.

In the component built-in board 1 configured in this way, the wiring 24 of the intermediate board 20 is formed at a position overlapping in the stacking direction a gap between an inner periphery of the opening 19 and an outer periphery of the electronic component 90 of the double-sided board 10, hence inflow or a flow amount of the adhesive layers 22 and 33 flowing into or flowing in this gap during collective stacking can be suppressed. As a result, deformation of the board overall can be prevented.

In addition, each of the electronic components 90 is housed in the opening 19 to be built in in the stacking direction, hence a thickness of a place where the electronic component 90 is built in can be adjusted to a thickness substantially equivalent to a thickness of the double-sided board 10, and thickness of the board overall can be suppressed to achieve thinning. Furthermore, after producing the double-sided board 10, the intermediate board 20, and the single-sided board 30 of simple structure and housing the electronic component 90, manufacturing can be performed by collective stacking by, for example, thermal compression bonding, hence a manufacturing step can be simplified. Moreover, the electronic component 90 housed in the opening 19 has its periphery surrounded by the adhesive layers 22 and 33, and the resin base 21 of the intermediate board 20 intervenes between each of the electronic components 90 in the stacking direction, hence it is also possible for insulating reliability to be raised while securing mechanical strength in the stacking direction.

Next, a method of manufacturing the component built-in board 1 according to the first embodiment will be described.

FIGS. 4 to 7 are each a flowchart showing manufacturing steps due to the method of manufacturing a component built-in board. In addition, FIGS. 8A to 10E are each a cross-sectional view showing the component built-in board on a manufacturing step basis. First, the manufacturing steps of the single-sided board 30 will be described with reference to FIG. 4.

Figure 8A:
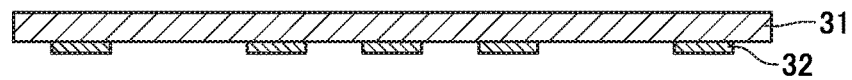
FIG. 8A is a cross-sectional view showing the same component built-in board on a manufacturing step basis.

As shown in FIG. 8A, a conductor of a single-sided CCL in which a conductor layer configured from the likes of a solid-state copper foil is formed on one of surfaces of the resin base 31, has an etching resist formed thereon by, for example, photolithography, and then etching is performed to pattern form the wiring 32 (step S100). The wiring 32 may be formed by a method where a conductor thin film is formed on the resin base 31 by the likes of vapor deposition or sputtering, and then, after formation of a plating resist by the likes of photolithography, electrolytic plating is performed, and after detachment of the plating resist, the previously formed conductor thin film is removed by etching (semi-additive method).

The single-sided CCL employed here is, for example, configured from a structure in which the resin base 31 having a thickness of about 25 µm is affixed to the conductor layer configured from copper foil having a thickness of about 12 µm. Employable as this single-sided CCL is, for example, a single-sided CCL produced by applying a varnish of polyimide to copper foil and hardening the varnish, by a publicly known casting method. Otherwise employable as the single-sided CCL are the likes of a single-sided CCL in which a seed layer is formed on a polyimide film by sputtering and the conductor layer is formed by growing copper by plating, or a single-sided CCL produced by attaching a rolled or electrolytic copper foil and a polyimide film by an adhesive material. Note that the resin base 31 is not necessarily required to be configured from a polyimide, and as described above, may be configured from a plastic film of a liquid crystal polymer, or the like. Moreover, an etchant whose main component is the likes of ferric chloride or cupric chloride may be employed in the above-described etching.

Next, an adhesive material is attached, by the likes of lamination, to the other of the surfaces on an opposite side to a wiring 32 side of the resin base 31 (step S102), thereby forming the adhesive layer 33. Employable as the adhesive material attached in this step S102 is, for example, an epoxy system thermosetting film having a thickness of about 25 µm. An example of the attaching includes employing a vacuum laminator to, for example, heat-press and attach in a reduced pressure atmosphere, at a temperature where the adhesive material does not harden, by a pressure of 0.3 MPa. Note that the adhesive material employed in the adhesive layer 33 or the adhesive layer 22 of the intermediate board 20 may be not only the epoxy system thermosetting resin, but also the likes of an acrylic system adhesive material or a thermoplastic adhesive material typified by a thermoplastic polyimide, and so on. Moreover, the adhesive material is not necessarily required to be in a film state, and may have resin coated in a varnish state.

Figure 8B:
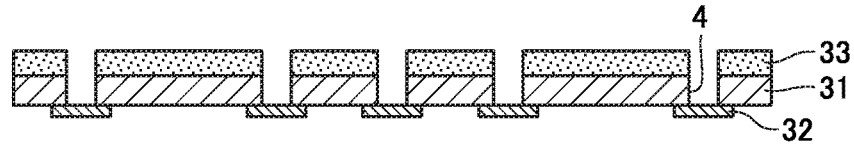
FIG. 8B is a cross-sectional view showing the same component built-in board on a manufacturing step basis.

Then, as shown in FIG. 8B, a UV-YAG laser device, for example, is employed to irradiate laser light from an adhesive layer 33 side toward the wiring 32, whereby the via hole 4 penetrating the adhesive layer 33 and the resin base 31 is formed at a certain place (step S104). After formation of the via hole 4, the inside of the formed via hole 4 undergoes, for example, plasma desmear processing.

The via hole 4 may otherwise by formed by the likes of a carbon dioxide laser ($CO_2$ laser) or an excimer laser, or may be formed by the likes of drill processing or chemical etching. Moreover, the desmear processing can be performed by a mixed gas of $CF_4$ and $O_2$ (tetrafluoromethane+oxygen), but may also employ another inert gas such as Ar (argon), and may be configured as wet desmear processing employing a chemical, rather than so-called dry processing.

Figure 8C:
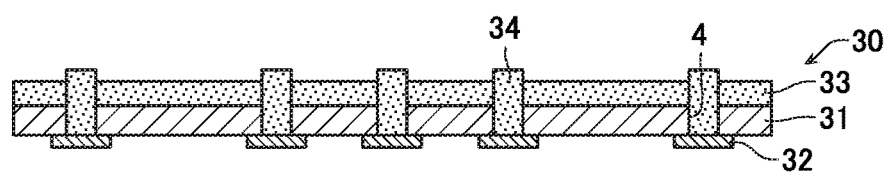
FIG. 8C is a cross-sectional view showing the same component built-in board on a manufacturing step basis.

As shown in FIG. 8C, when the via hole 4 has been formed, the conductive paste of the above-mentioned kind is filled into the formed via hole 4 by the likes of screen printing, for example (step S106), to form the via 34, whereby a plurality of the single-sided boards 30 each including the resin base 31 provided with the adhesive layer 33, are manufactured.

Figure 8D:
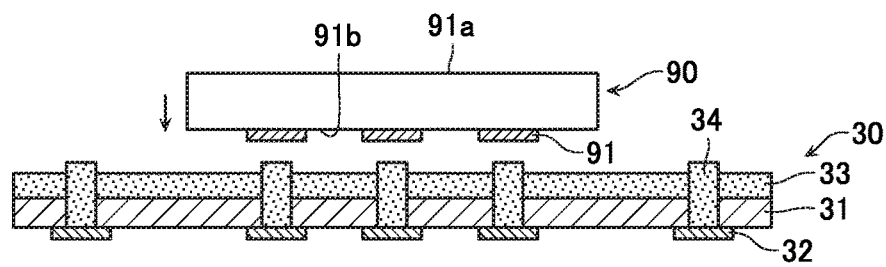
FIG. 8D is a cross-sectional view showing the same component built-in board on a manufacturing step basis.

Note that as shown in FIG. 8D, the re-wiring electrode 91 of the electronic component 90 separately manufactured as required is aligned with a certain via 34 of the single-sided board 30 using, for example, an electronic component mounting device not illustrated, and heat is applied at a temperature not exceeding curing temperatures of the adhesive layer 33 of the single-sided board 30 and the conductive paste of the via 34, whereby the electronic component 90 is provisionally adhered and mounted as shown by the arrow of FIG. 8D (step S108). In such a way, a plurality of the single-sided boards 30 and the single-sided boards 30 having the electronic component 90 mounted thereon, are prepared in advance.

Figure 5:
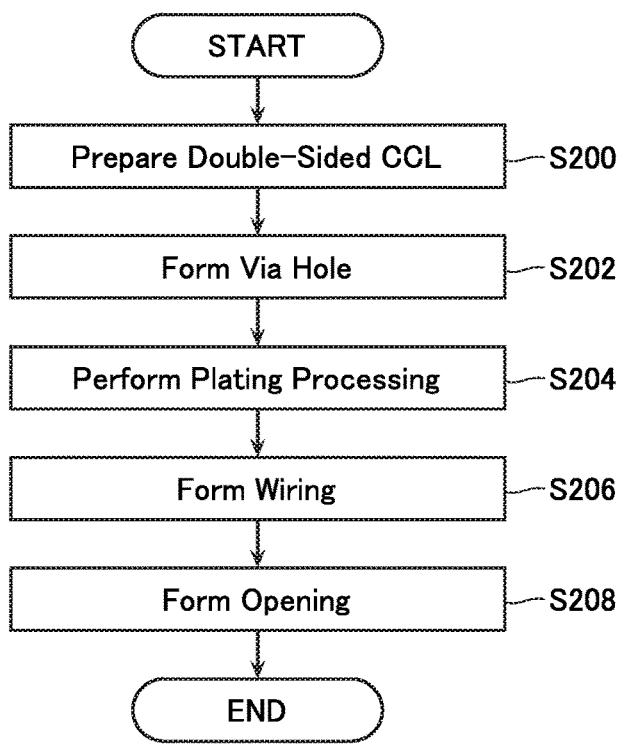
FIG. 5 is a flowchart showing manufacturing steps due to the method of manufacturing the same component built-in board.

Next, the manufacturing steps of the double-sided board 10 will be described with reference to FIG. 5.

First, a double-sided CCL in which a conductor layer is formed on both surfaces of the resin base 11 is prepared (step S200), the via hole 2 is formed at a certain place (step S202), and plasma desmear processing, for example, is performed. Next, panel plate processing is performed on all surfaces of the resin base 11 (step S204) to form a plating layer on the conductor layer and in the via hole 2, and thereby form a prototype of the wiring 12 and the via 13.

Figure 9A:
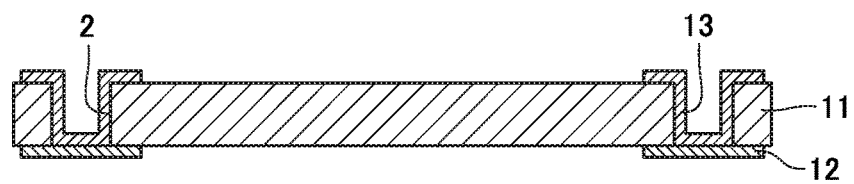
FIG. 9A is a cross-sectional view showing the same component built-in board on a manufacturing step basis.
Figure 9B:
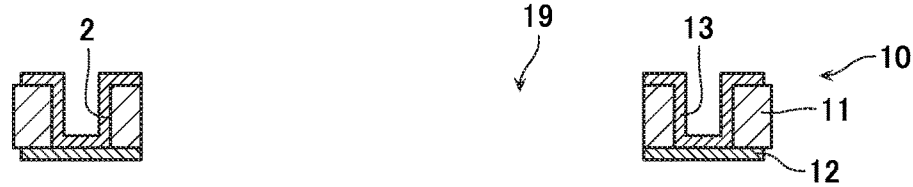
FIG. 9B is a cross-sectional view showing the same component built-in board on a manufacturing step basis.

Then, as shown in FIG. 9A, etching, and so on, is performed on both surfaces of the resin base 11 to pattern form the likes of the wiring 12 or the via 13 (step S206). Finally, as shown in FIG. 9B, the resin base 11 at a portion thereof where the electronic component 90 is to be built in is removed by irradiating with laser light using the likes of the above-mentioned kind of UV-YAG laser device to form the opening 19 having a certain opening diameter (step S208), whereby a plurality of the double-sided boards 10 each including the opening 19 where the electronic component 90 is to be housed, are manufactured.

Figure 6:
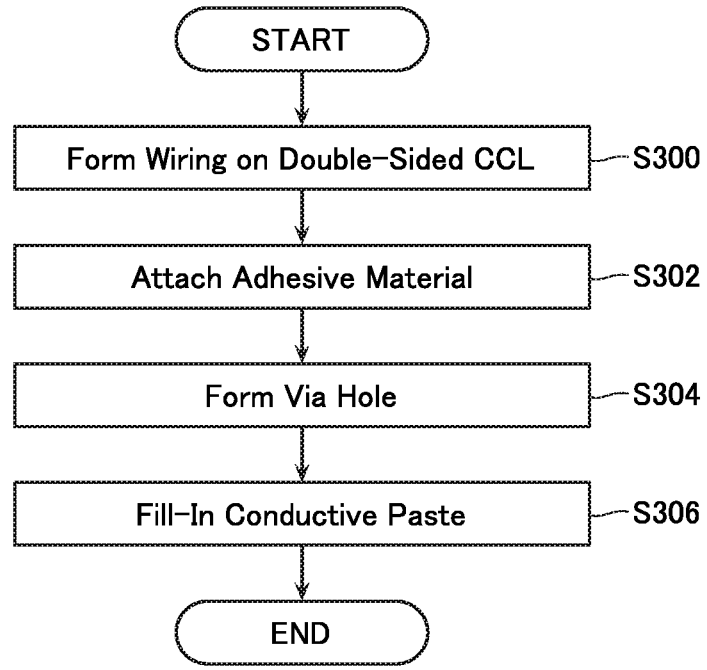
FIG. 6 is a flowchart showing manufacturing steps due to the method of manufacturing the same component built-in board.

Next, the manufacturing steps of the intermediate board 20 will be described with reference to FIG. 6.

Figure 10A:
FIG. 10A is a cross-sectional view showing the same component built-in board on a manufacturing step basis.
Figure 10B:
FIG. 10B is a cross-sectional view showing the same component built-in board on a manufacturing step basis.
Figure 10C:
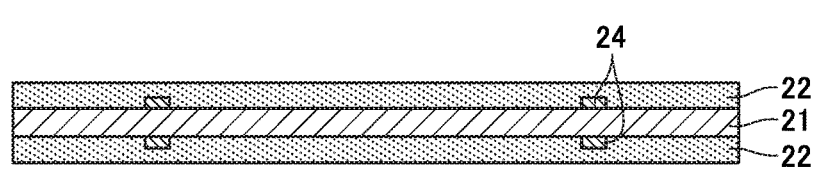
FIG. 10C is a cross-sectional view showing the same component built-in board on a manufacturing step basis.

First, as shown in FIG. 10A, a double-sided CCL in which a conductor layer is formed on both surfaces of the resin base 21 configured from, for example, a polyimide film, is prepared, and, as shown in FIG. 10B, etching, and so on, is performed to form the wiring 24 (step S300). Then, as shown in FIG. 10C, the adhesive material is attached to sides of both surfaces of the resin base 21 (step S302), thereby forming the adhesive layer 22.

Figure 10D:
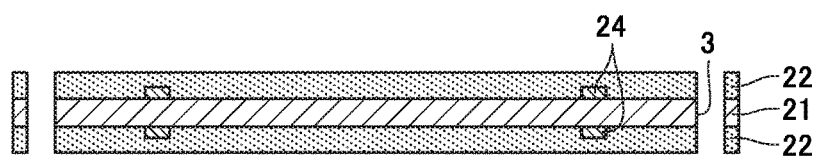
FIG. 10D is a cross-sectional view showing the same component built-in board on a manufacturing step basis.
Figure 10E:
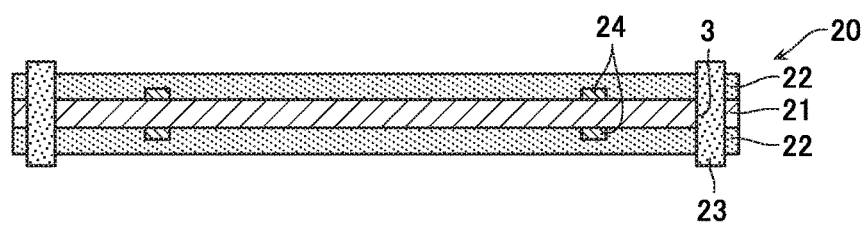
FIG. 10E is a cross-sectional view showing the same component built-in board on a manufacturing step basis.

Next, as shown in FIG. 10D, the via hole 3 penetrating the adhesive layer 22 and the resin base 21 is formed at a certain place (step S304), and finally, as shown in FIG. 10E, the conductive paste is filled into the via hole 3 (step S306) to form the via 23, whereby the intermediate board 20 including the resin base 21 having the adhesive layer 22 provided on both surfaces thereof, is manufactured.

Figure 7:
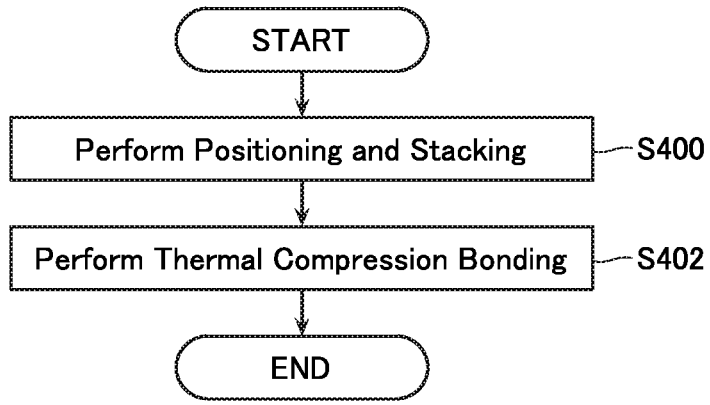
FIG. 7 is a flowchart showing manufacturing steps due to the method of manufacturing the same component built-in board.

When the plurality of double-sided boards 10, the intermediate board 20, and the plurality of single-sided boards 30 have been produced in this way, then as shown in FIG. 7, each of the electronic components 90 mounted on each of the single-sided boards 30 and the opening 19 of each of the double-sided boards 10 are aligned, and the intermediate board 20 is aligned such that the wiring 24 is at a position overlapping in the stacking direction a gap between an inner periphery of the opening 19 and an outer periphery of the electronic component 90, to perform positioning and stacking (step S400).

Finally, for example, in the case of performing thermal compression bonding, a vacuum press is employed to collectively stack by thermal compression bonding by applying heat and pressure in a reduced pressure atmosphere of 1 kPa or less (step S402), whereby the component built-in board 1 of the kind shown in FIG. 1 is manufactured. During collective stacking, hardening and alloying of the conductive paste filled into the via holes 3 and 4 are performed simultaneously to flow and hardening of the adhesive layers 22 and 33 between layers or in the opening 19.

The adhesive layers 22 and 33 have their inflow into or flow in the gap between the inner periphery of the opening 19 and the outer periphery of the electronic component 90 suppressed by the wiring 24 of the intermediate board 20, hence warping and deformation of the board overall accompanying this inflow or flow can be suppressed. Moreover, due to an alloy layer of an intermetallic compound, mechanical strength of connections of each of the wirings 12 and 32 or vias 23 and 34 can be increased, and connection reliability can be increased. Note that stacking processing of each of the boards 10, 20, and 30 is not limited to collective stacking by thermal compression bonding.

Figure 11:
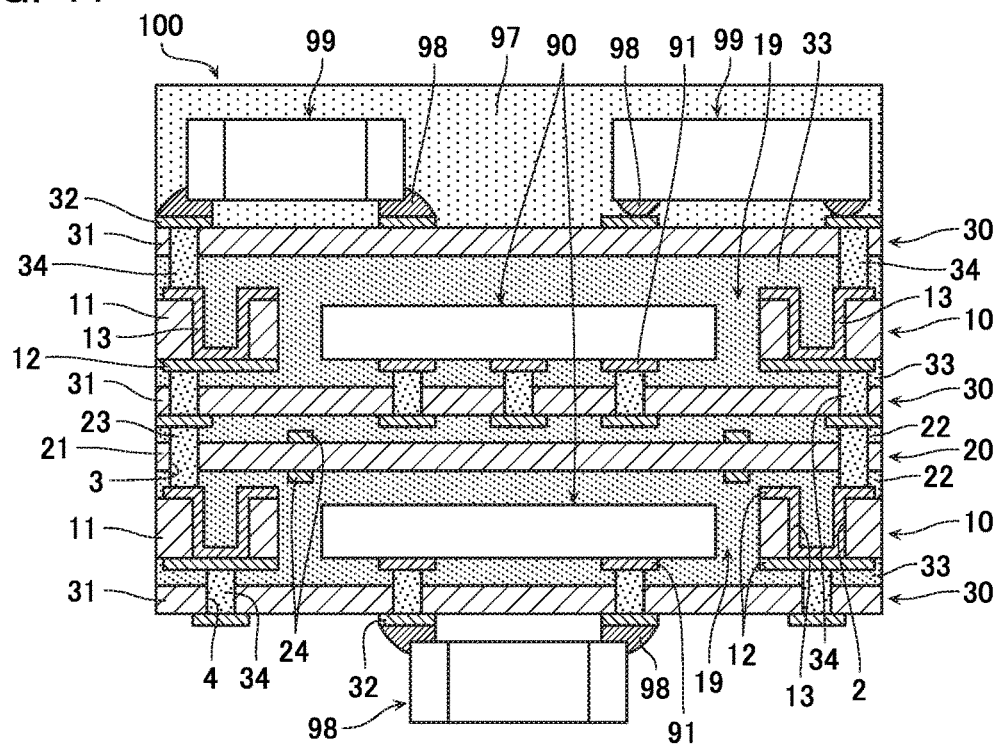
FIG. 11 is a cross-sectional view showing a mounting body comprising the component built-in board according to the first embodiment of the present invention.

FIG. 11 is a cross-sectional view showing a mounting body comprising the component built-in board according to the first embodiment of the present invention. A mounting body 100 has surface-mounted on a front surface side and a back surface side of the component built-in board 1 according to the first embodiment another electronic component 99 which is different from each of the electronic components 90 built into the component built-in board 1 according to the first embodiment. Each of the surface-mounted electronic components 99 is connected to the wiring 32 of the single-sided board 30 via solder 98, by solder reflow processing at a temperature of approximately about 260° C., for example.

In the illustrated example, the component built-in board 1 has one electronic component 99 surface-mounted on its back surface side and two electronic components 99 surface-mounted on its front surface side, but the two electronic components 99 on the front surface side are further sealed above the wiring 32 by a resin member 97 due to a mold resin, or the like. The mounting body 100 configured in this way can display similar working effects to those mentioned above, and since warping or deformation of the component built-in board 1 overall is suppressed, surface mounting can be reliably performed, and since solder is not employed in the component built-in board 1, high connection reliability can be secured without solder remelting inside the board during solder reflow.

Figure 12:
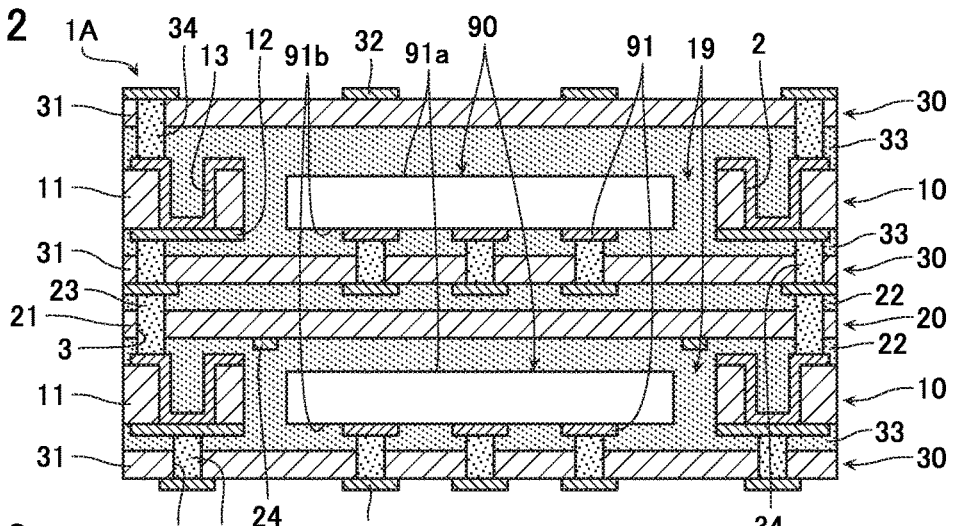
FIG. 12 is a cross-sectional view showing a component built-in board according to a second embodiment of the present invention.

FIG. 12 is a cross-sectional view showing a component built-in board according to a second embodiment of the present invention. A component built-in board 1A according to the second embodiment differs from the component built-in board 1 according to the first embodiment in that the wiring 24 of the intermediate board 20 of the component built-in board 1 according to the first embodiment is formed only on a lower surface side (downward side in the stacking direction) and not on sides of both surfaces of the resin base 21.

Figure 13:
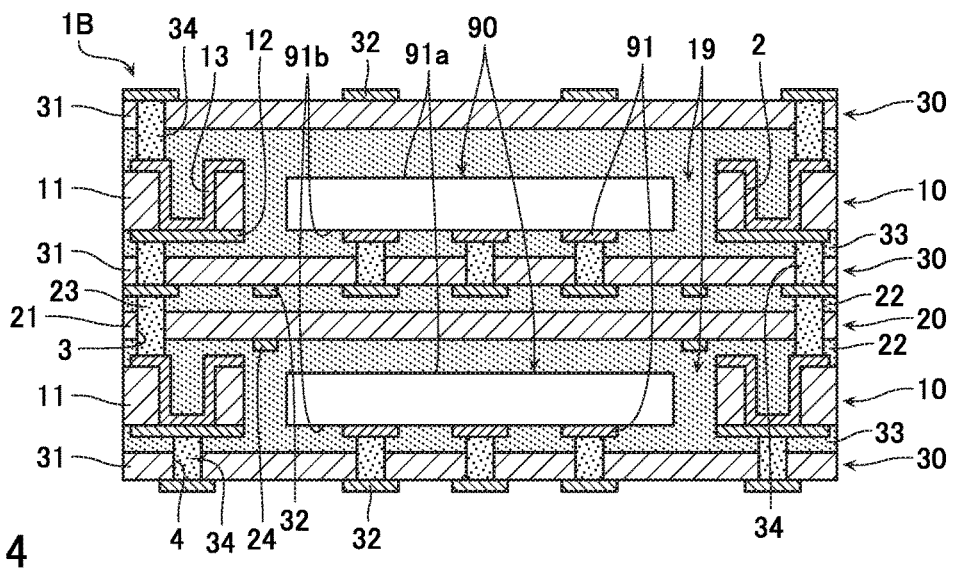
FIG. 13 is a cross-sectional view showing a component built-in board according to a third embodiment of the present invention.

FIG. 13 is a cross-sectional view showing a component built-in board according to a third embodiment of the present invention. A component built-in board 1B according to the third embodiment differs from the component built-in board 1A according to the second embodiment in that the wiring 24 of the intermediate board 20 of the component built-in board 1A according to the second embodiment and some of the wirings 32 acting as the fourth wiring layer of the single-sided board 30 disposed adjacently on an upward side in the stacking direction of the intermediate board 20 are formed at a position overlapping in the stacking direction a gap between an inner periphery of the opening 19 and an outer periphery of the electronic component 90 of the double-sided board 10 on a downward side in the stacking direction. Note that these some of the wirings 32 may be dummy wirings.

Figure 14:
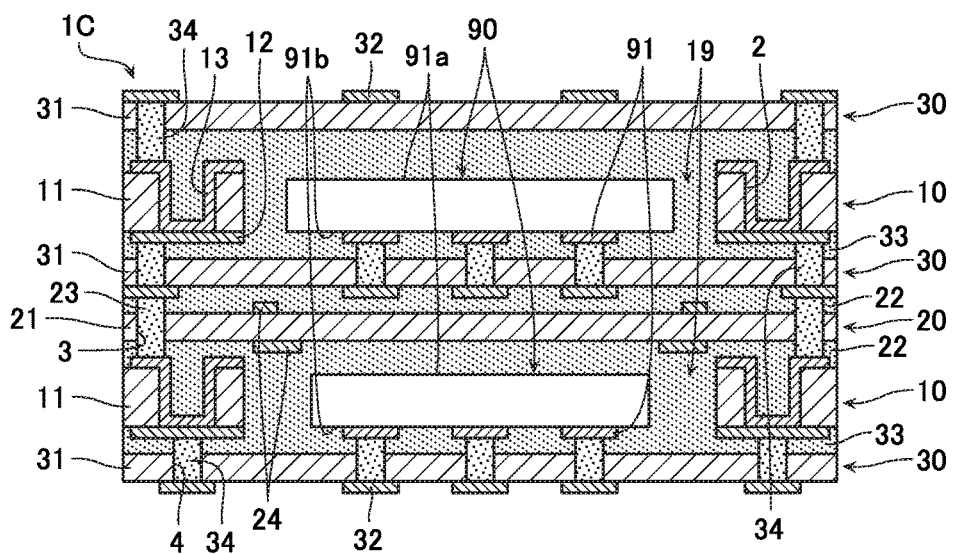
FIG. 14 is a cross-sectional view showing a component built-in board according to a fourth embodiment of the present invention.

FIG. 14 is a cross-sectional view showing a component built-in board according to a fourth embodiment of the present invention. A component built-in board 1C according to the fourth embodiment differs from the component built-in board 1 according to the first embodiment in that the wiring 24 of the intermediate board 20 of the component built-in board 1 of the first embodiment is formed such that its width differs between an upper surface side and a lower surface side of the resin base 21 depending on a difference in a width of the electronic component 90 on an upward side and a width of the electronic component 90 on a downward side in the stacking direction sandwiching the intermediate board 20.

That is, in the component built-in board 1C, a width of a gap between the inner periphery of the opening 19 and the outer periphery of the electronic component 90 on the downward side in the stacking direction of the intermediate board 20 is broader than a width of a gap between the inner periphery of the opening 19 and the outer periphery of the electronic component 90 on the upward side in the stacking direction of the intermediate board 20, hence the wiring 24 on the lower surface side of the resin base 21 is formed with broader width than the wiring 24 on the upper surface side of the resin base 21.

Figure 15:
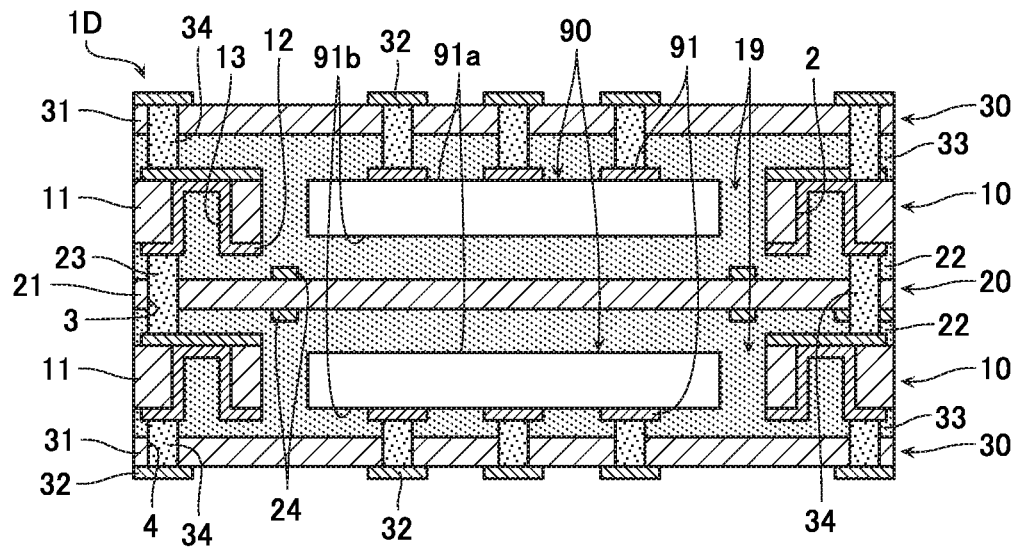
FIG. 15 is a cross-sectional view showing a component built-in board according to a fifth embodiment of the present invention.

FIG. 15 is a cross-sectional view showing a component built-in board according to a fifth embodiment of the present invention. A component built-in board 1D according to the fifth embodiment differs from the component built-in board 1 according to the first embodiment in that an arrangement configuration of each of the boards on a more upward side in the stacking direction than the intermediate board 20 of the component built-in board 1 according to the first embodiment is different.

That is, the fact that in the component built-in board 1D, the double-sided board 10 and the single-sided board 30 are disposed in that order toward a more upward side in the stacking direction than the intermediate board 20, each of the double-sided boards 10 are disposed stacked such that fellow back surfaces 91a of each of the electronic components 90 housed in the opening 19 of each of the double-sided boards 10 face each other sandwiching the intermediate board 20, and the single-sided board 30 disposed in an outermost layer of the component built-in board 1 is omitted, differs from the component built-in board 1 according to the first embodiment.

Stacking arrangement modes of each of the boards 10, 20, and 30, directed from the upward side to the downward side or from the downward side to the upward side in the stacking direction, are each configured as the single-sided board 30, the double-sided board 10, the intermediate board 20, the double-sided board 10, and the single-sided board 30. This makes it possible to configure the component built-in board 1D of five-layer structure having a plurality of electronic components 90 built in thereto.

Figure 16:
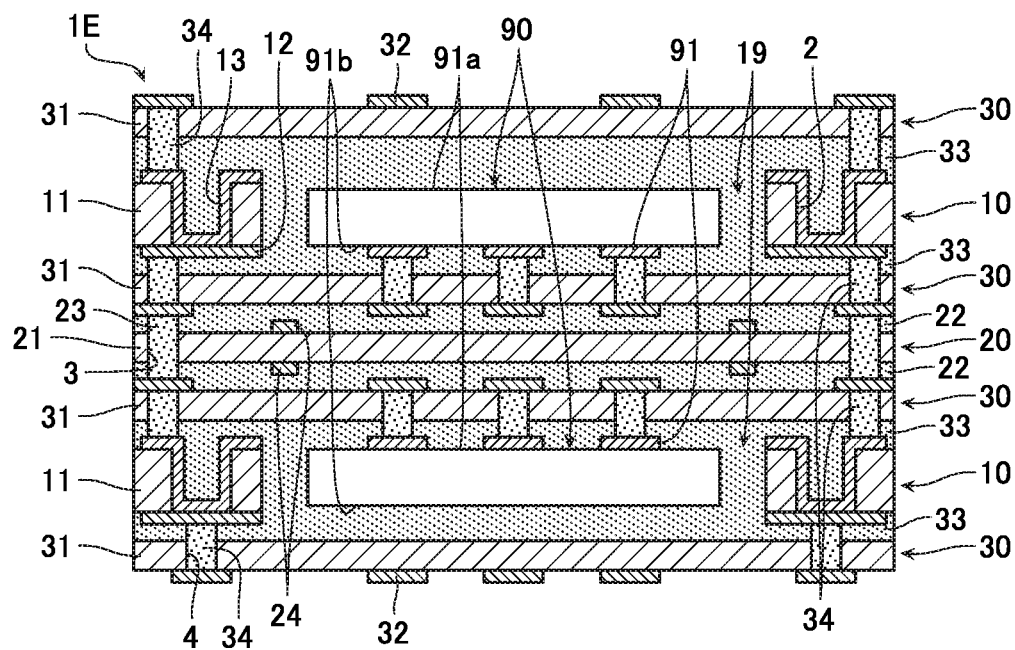
FIG. 16 is a cross-sectional view showing a component built-in board according to a sixth embodiment of the present invention.

FIG. 16 is a cross-sectional view showing a component built-in board according to a sixth embodiment of the present invention. A component built-in board 1E according to the sixth embodiment differs from the component built-in board 1 according to the first embodiment in that an arrangement configuration of each of the boards on a more downward side in the stacking direction than the intermediate board 20 of the component built-in board 1 according to the first embodiment is different.

That is, the fact that in the component built-in board 1E, the single-sided board 30, the double-sided board 10, and the single-sided board 30 are disposed in that order toward a more downward side in the stacking direction than the intermediate board 20, and each of the double-sided boards 10 are disposed stacked such that fellow electrode formation surfaces 91b of each of the electronic components 90 housed in the opening 19 of each of the double-sided boards 10 face each other sandwiching the intermediate board 20, differs from the component built-in board 1 according to the first embodiment.

In this way, configurations of the component built-in boards 1A to 1E according to these second through sixth embodiments also allow display of similar working effects to those of the first embodiment, namely the working effects that inflow or a flow amount of the adhesive layer into the above-mentioned gap can be suppressed to prevent deformation of the component built-in board overall, and thinning of the component built-in board overall can be achieved by a simple manufacturing step.

While certain embodiments have been described, these embodiments have been presented by way of example only, and are not intended to limit the scope of the inventions. Indeed, the novel methods and device described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A component built-in board of multi-layer structure comprising a plurality of unit boards stacked therein and a plurality of electronic components built in thereto in a stacking direction, wherein
the plurality of electronic components include a first electronic component, and
the plurality of unit boards include;
a first board having a first insulating layer comprising an opening in which the first electronic component is housed; and
an intermediate board adjacent to the first board and comprising a second insulating layer and a first adhesive layer provided on at least a first side of the second insulating layer facing the first board, and
the intermediate board includes a first wiring layer on a first surface on the first side of the second insulating layer facing the first board, and the first wiring layer overlapping a gap between an inner periphery of the opening and an outer periphery of the first electronic component of the first board,
wherein the first wiring layer is entirely disposed within a region on the first surface defined by a boundary of the gap in the stacking direction,
wherein the first wiring layer projects from the first surface toward the gap, and is covered entirely by the first adhesive layer.

2. The component built-in board according to claim 1, wherein
the plurality of unit boards include:
a second board comprising: a second wiring layer formed on a side of one surface of a third insulating layer; a first inter-layer conductive layer penetrating the third insulating layer and being connected to the second wiring layer; and a second adhesive layer being provided on a side of the other surface of the third insulating layer, and
the second board has a part of the first inter-layer conductive layer connected to the first electronic component on a side of the second adhesive layer.

3. The component built-in board according to claim 1, wherein
the plurality of electronic components include a second electronic component, and
the plurality of unit boards include:
a third board that is disposed on an opposite side to the first board of the intermediate board, has a fourth insulating layer, and comprises an opening in which the second electronic component is housed at a position overlapping in the stacking direction the first electronic component.

4. The component built-in board according to claim 3, wherein
the intermediate board includes: a third wiring layer formed at a position overlapping in the stacking direction a gap between an inner periphery of the opening and an outer periphery of the second electronic component of the third board on a surface on a side of the third board of the second insulating layer; and the first adhesive layer provided on the third board side.

5. The component built-in board according to claim 3, wherein
the plurality of unit boards include:
a fourth board that is disposed between the third board and the intermediate board, comprises: a fourth wiring layer formed on a side of one surface of a fifth insulating layer; a second inter-layer conductive layer penetrating the fifth insulating layer and being connected to the fourth wiring layer; and a third adhesive layer being provided on a side of the other surface of the fifth insulating layer, and
a part of the fourth wiring layer is formed at a position overlapping in the stacking direction a gap between an inner periphery of the opening and an outer periphery of the second electronic component of the third board on a surface on a side of the intermediate board of the fifth insulating layer.

6. The component built-in board according to claim 1, wherein
the first wiring layer of the intermediate board is a dummy wiring layer.

7. The component built-in board according to claim 4, wherein
the third wiring layer of the intermediate board is a dummy wiring layer.

8. The component built-in board according to claim 5, wherein
a part of the fourth wiring layer of the fourth board is a dummy wiring layer.

9. A mounting body having another electronic component surface-mounted on at least one mounting surface of a front surface and a back surface of the component built-in board described in claim 1.

10. The mounting body according to claim 9, wherein
the plurality of unit boards include:
a second board comprising: a second wiring layer formed on a side of one surface of a third insulating layer; a first inter-layer conductive layer penetrating the third insulating layer and being connected to the second wiring layer; a second adhesive layer being provided on a side of the other surface of the third insulating layer, and
the second board has a part of the first inter-layer conductive layer connected to the first electronic component on a side of the second adhesive layer.

11. The mounting body according to claim 9, wherein
the plurality of electronic components include a second electronic component, and
the plurality of unit boards include:
a third board that is disposed on an opposite side to the first board of the intermediate board, has a fourth insulating layer, and comprises an opening in which the second electronic component is housed at a position overlapping in the stacking direction the first electronic component.

12. The mounting body according to claim 11, wherein
the intermediate board includes: a third wiring layer formed at a position overlapping in the stacking direction a gap between an inner periphery of the opening and an outer periphery of the second electronic component of the third board on a surface on a side of the third board of the second insulating layer; and the first adhesive layer provided on the third board side.

13. The mounting body according to claim 11, wherein
the plurality of unit boards include:
a fourth board that is disposed between the third board and the intermediate board, comprises: a fourth wiring layer formed on a side of one surface of a fifth insulating layer; a second inter-layer conductive layer penetrating the fifth insulating layer and being connected to the fourth wiring layer; and a third adhesive layer being provided on a side of the other surface of the fifth insulating layer, and
a part of the fourth wiring layer is formed at a position overlapping in the stacking direction a gap between an inner periphery of the opening and an outer periphery of the second electronic component of the third board on a surface on a side of the intermediate board of the fifth insulating layer.

14. The component built-in board according to claim 1, wherein the gap surrounds the outer periphery of the first electronic component, and the first wiring layer extends along a surrounding shape of the gap.

15. The component built-in board according to claim 1, wherein the first adhesive layer is bonded to the first electronic component, and the first adhesive layer enters the gap.

* * * * *